United States Patent
Haroun et al.

(10) Patent No.: US 6,621,441 B2
(45) Date of Patent: Sep. 16, 2003

(54) ATTENUATING UNDESIRED FREQUENCIES WHILE SAMPLING A COMMUNICATION SIGNAL

(75) Inventors: Baher S. Haroun, Allen, TX (US); Gabriel J. Gomez, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/850,435

(22) Filed: May 7, 2001

(65) Prior Publication Data

US 2002/0030617 A1 Mar. 14, 2002

Related U.S. Application Data

(60) Provisional application No. 60/204,902, filed on May 15, 2000.

(51) Int. Cl.[7] .................................................. H03M 1/12
(52) U.S. Cl. ....................................... 341/155; 341/172
(58) Field of Search ................................ 341/155, 118, 341/120, 143, 172

(56) References Cited

U.S. PATENT DOCUMENTS

| | | | | |
|---|---|---|---|---|
| 6,005,506 A | * | 12/1999 | Bazarjani et al. | 341/143 |
| 6,285,311 B1 | * | 9/2001 | Lewicki | 341/172 |

OTHER PUBLICATIONS

Copy of copending U.S. Serial No. 09/828,338 file on Apr. 6, 2001 (Docket TI–30896).

* cited by examiner

Primary Examiner—Brian Young
Assistant Examiner—Joseph Lauture
(74) Attorney, Agent, or Firm—Ronald O. Neerings; Wade James Brady, III; Frederick J. Telecky, Jr.

(57) ABSTRACT

An analog signal ($V_{IN}$) is converted into a digital signal (24) by sampling the analog signal at a plurality of points in time to produce a sampled signal (32) which represents the analog signal. A filtering operation is advantageously incorporated into the sampling operation (102). The filtering operation filters the analog signal such that the sampled signal represents a filtered version of the analog signal. The digital signal is produced from the sampled signal.

32 Claims, 5 Drawing Sheets

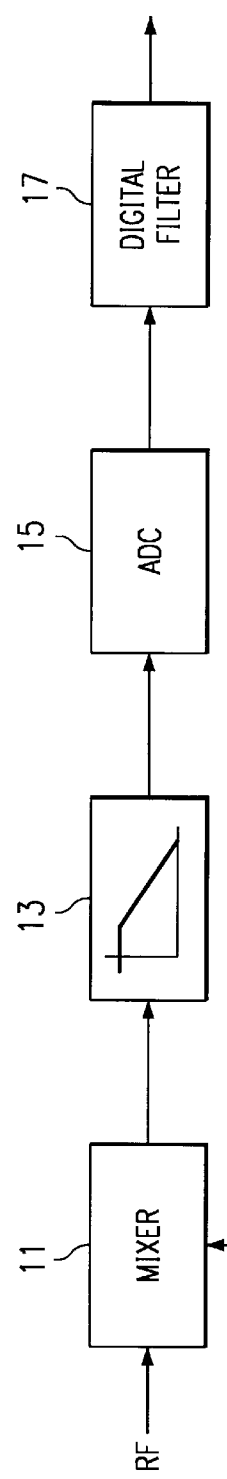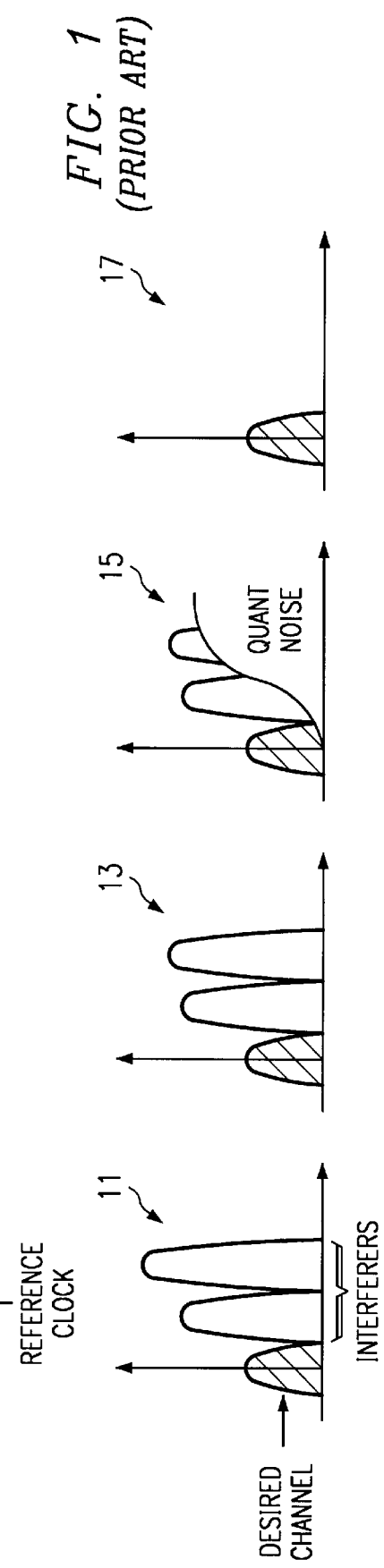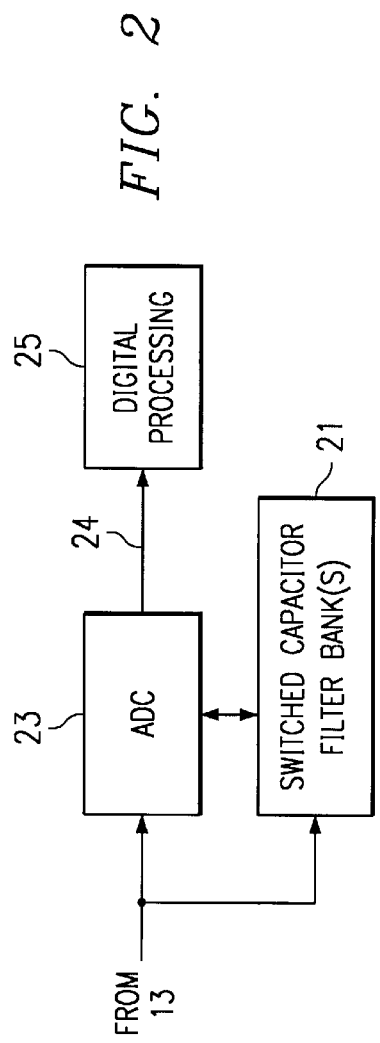

ATTENUATING UNDESIRED FREQUENCIES WHILE SAMPLING A COMMUNICATION SIGNAL

This application claims the priority under 35 U.S.C. 119(e)(1) of copending U.S. provisional application No. 60/204,902 filed on May 15, 2000.

FIELD OF THE INVENTION

The invention relates generally to frequency channel communications and, more particularly, to attenuation of undesired frequencies in frequency channel communications.

BACKGROUND OF THE INVENTION

In communications applications that utilize frequency channels, for example, wireless and wired RF communications, the energy in the desired frequency channel can be much lower than the energy in adjacent, undesired frequency channels. Accordingly, in order to extract communication signals from the desired frequency channel, communication receiver architectures must address the interference caused by adjacent frequency channels, particularly those of higher energy than the desired frequency channel.

Some conventional RF receiver architectures, such as super-heterodyne and direct conversion architectures, utilize high "Q" band-pass SAW filters (channel select filters) to attenuate the interferers. Such filters produce a relatively clean channel signal that can then be converted to digital format using conventional low-resolution analog-to-digital converters (ADCs). However, these filters are typically ceramic or crystal electromechanical filters which are disadvantageously large and costly, and which impose an undesirably large signal power loss.

In highly integrated communication systems, direct conversion architectures are typically preferred because they permit elimination of SAW filters and hence component count reduction. These architectures also permit the desired channel selection to be performed in the digital domain using digital filters. An exemplary direct conversion architecture is illustrated diagrammatically in FIG. 1. The RF communication signal is mixed down at 11, and applied to an anti-aliasing filter at 13. The output of the anti-aliasing filter 13 is applied to a high frequency analog-to-digital converter (e.g., a $\Delta\Sigma$ modulator) 15. The analog-to-digital converter (ADC) works at a selected sampling rate to digitize the entire frequency band including the interferers. The interferers are then attenuated by digital filtering at 17. The respective signal outputs from each of the components 11, 13, 15 and 17 are also graphically illustrated in FIG. 1.

Direct conversion architectures provide high integration capability by trading off analog filter complexity (eliminating the external analog SAW filter) for increases in the oversampling rate and dynamic range of the ADC. One advantage of this approach is the cost reduction due to elimination of external components, but the drawback is, in general, increased power consumption. The increased dynamic range requirement of the ADC is due to the higher interferer energy (relative to the desired signal) caused by the relaxed front-end filter.

Moreover, high linearity is needed in order to keep intermodulation products out of the desired frequency band. For example, in GSM systems, more than 80 dB is needed in a 135 KHz band and, in $3^{rd}$ generation wireless systems, nearly 80 dB is needed in a 2 MHz bandwidth. Thus, the required ADC design is very challenging, and disadvantageously consumes large amounts of power. Another disadvantage of direct conversion architectures is that, because the interferers are converted into digital format together with the desired signal, any gain provided by automatic gain control (AGC) is also applied to the interferers.

It is therefore desirable to provide for attenuation of interfering frequency channels without the aforementioned disadvantages of the conventional approaches.

The invention incorporates switched capacitor filtering into the process of sampling the analog signal at the input of the ADC. Merging the switched capacitor filter with the ADC advantageously eliminates the need for a large, costly analog filter, while still avoiding complicated ADC design features described above.

BRIEF DESCRIPTION OF THE DRAWINGS

FIG. 1 diagrammatically illustrates an example of a conventional direct conversion receiver architecture.

FIG. 2 diagrammatically illustrates pertinent portions of exemplary embodiments of a communication receiver according to the invention.

DETAILED DESCRIPTION

Figure 3:
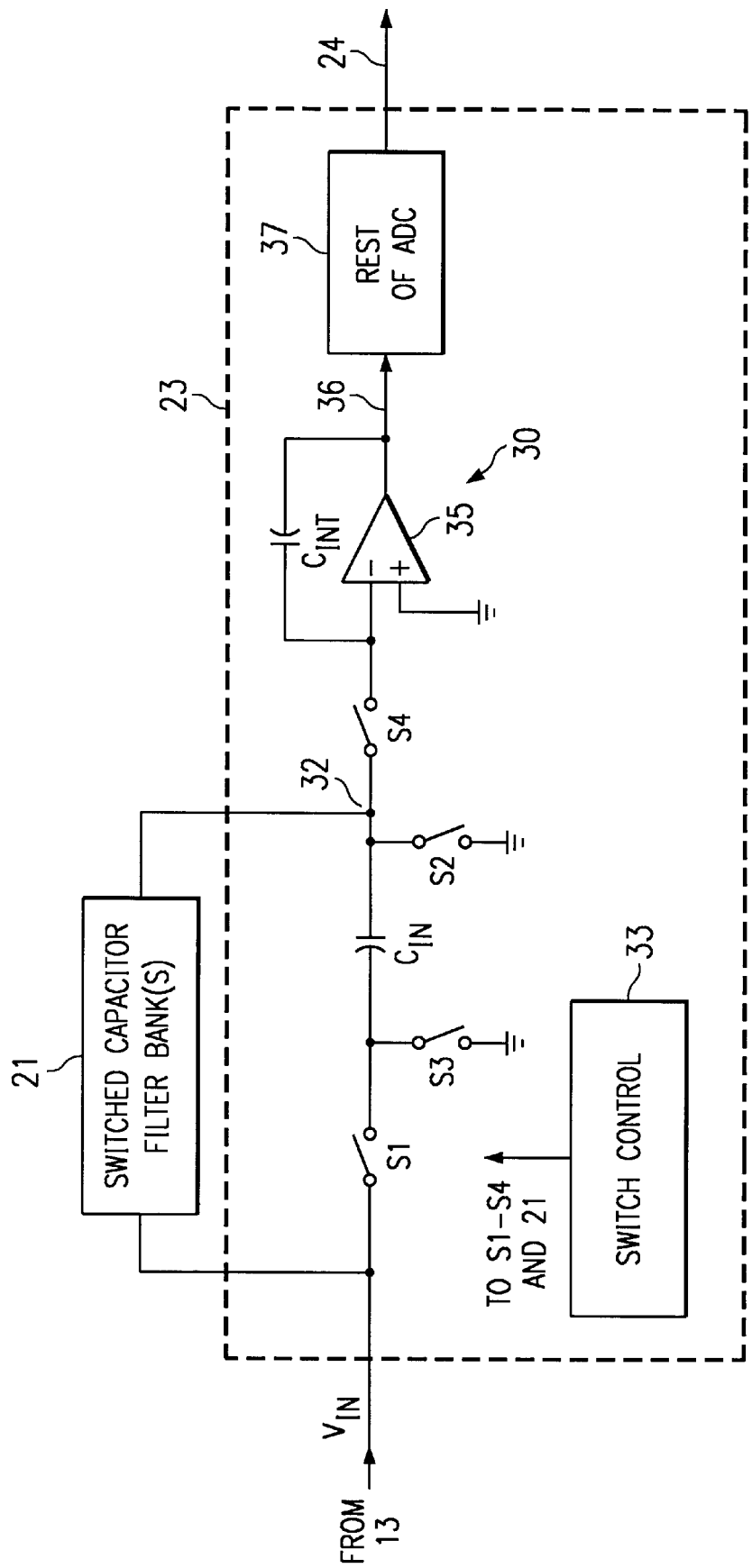
FIG. 3 diagrammatically illustrates pertinent portions of FIG. 2 in more detail.

FIG. 2 diagrammatically illustrates pertinent portions of exemplary embodiments of a communication receiver (e.g., GSM or CDMA) according to the invention. A baseband portion of the communication receiver example of FIG. 2 includes an ADC 23 (e.g. a $\Delta\Sigma$ modulator) coupled to receive an analog input from, for example, an anti-aliasing filter such as illustrated at 13 in FIG. 1. The ADC 23 is coupled to a switched capacitor filter bank (or a plurality of such filter banks) at 21. The filter bank 21 is also coupled to receive the output of the anti-aliasing filter 13. The switched capacitor filter bank 21 is cooperable with the ADC 23 for attenuating interferers in conjunction with the sampling operation of the ADC 23. Thus, in the digitized output 24 of the ADC 23, the interfering frequencies have been attenuated by operation of the switched capacitor filter bank 21. The signal 24, containing digitized information indicative of the desired communication on the desired frequency channel, is applied to a digital processing section 25 which can process the signal, for example, in any desired conventional manner.

FIG. 3 diagrammatically illustrates pertinent portions of exemplary embodiments of the ADC 23 of FIG. 2. In particular, FIG. 3 illustrates one example of a single ended input sampling network for a switched capacitor circuit. The switches S1 and S2 are controlled by a switch controller 33 for sampling the analog input signal $V_{IN}$ by storing the associated charge in capacitor $C_{IN}$. Switches S3 and S4 are cooperable under control of the switch controller 33 for dumping the charge stored in capacitor $C_{IN}$ in order to drive an integrator 30 including an operational amplifier 35 and an integrating capacitor $C_{INT}$. The output 36 of the integrator is provided to further portions 37 of the ADC 23. These further portions are well known in the art, and are therefore not explicitly detailed in FIG. 3. The switched capacitor arrangement at S1–S4 and $C_{IN}$ in FIG. 3 is also conventional (other standard arrangements could also be used), as is the integrator 30. According to the invention, the input signal $V_{IN}$ is applied to the switched capacitor filter bank(s) 21 which provide(s) an output signal at a charge summing node 32 of modulator 23.

Figure 4:
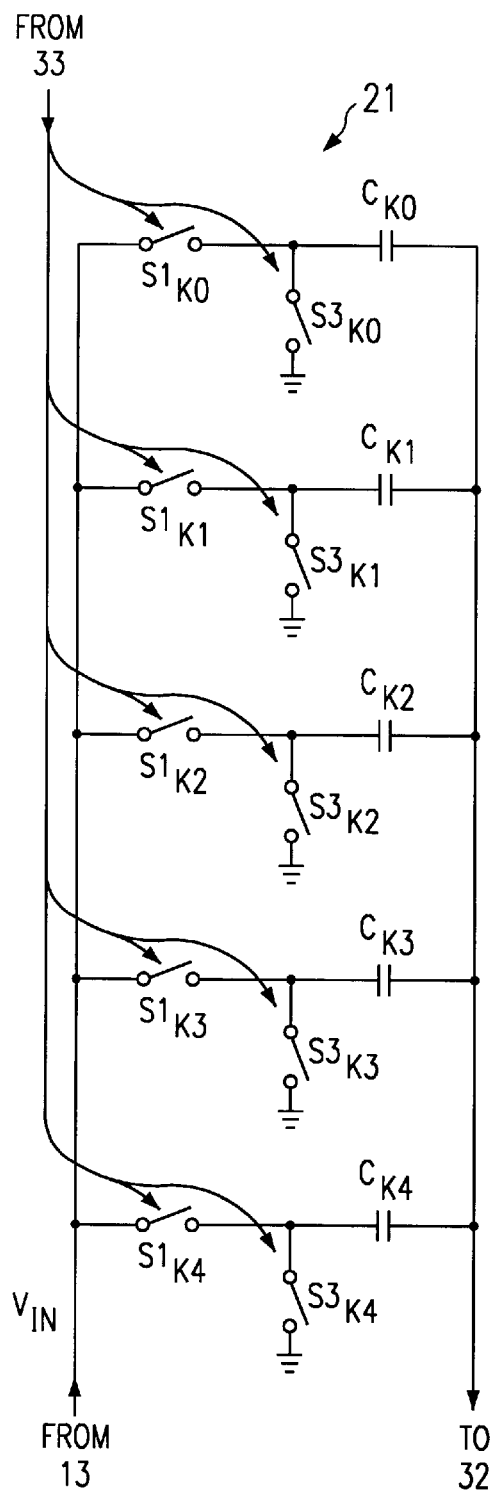
FIG. 4 illistrates an exemplary embodiment of a filter bank of FIG. 3.

FIG. 4 illustrates an exemplary embodiment of a switched capacitor filter bank 21 according to the invention. The filter bank example of FIG. 4 includes five sections designated generally by K0, K1, K2, K3 and K4. Each of these sections includes an associated pair of switches, $S1_{K0}$ and $S3_{K0}$, $S1_{K1}$, and $S3_{K1}$, etc. Each of the switch pairs of FIG. 4 corresponds operationally with the switch pair S1 and S3 in FIG. 3. For example, switch $S1_{K0}$ of FIG. 4 cooperates with switch S2 of FIG. 3 to sample the input signal $V_{IN}$ by storing charge in capacitor $C_{K0}$. Also, the switch $S3_{K0}$ of FIG. 4 cooperates with the switch S4 of FIG. 3 for dumping charge from the capacitor $C_{K0}$ to drive the integrator 30. The switch pairs of the remaining sections K1 through K4 of FIG. 4 also cooperate with switches S2 and S4 of FIG. 3 to perform sample and dump operations analogous to those described above with respect to section K0.

Figure 5:
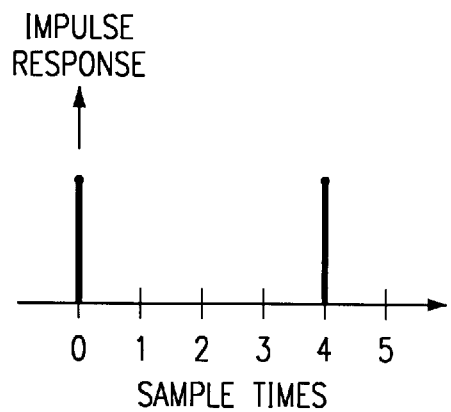
FIG. 5 graphically illustrates an exemplary impulse response associated with the filter bank of FIG. 4.

The switches of FIG. 4 are controlled by the switch controller 33 of FIG. 3 so as to implement a finite impulse response (FIR) filter, for example a filter having the impulse response illustrated in FIG. 5. In order to implement the filter characteristic illustrated in FIG. 5, the switch controller 33 controls the switches of FIG. 4 such that, during each sample and dump cycle performed by switches S1–S4 of FIG. 3, one of the switches $S1_{K0}$–$S1_{K4}$ of one of the filter sections of FIG. 4 cooperates with switch S2 of FIG. 3 to store charge (sample) in its associated capacitor, and one of the switches $S3_{K0}$–$S3_{K4}$ of another of the filter sections of FIG. 4 cooperates with switch S4 of FIG. 3 to dump charge from its associated capacitor.

A specific example of implementing the filter characteristic illustrated in FIG. 5 is described in the following steps (1)–(5). (1) During a given sample operation by switches S1 and S2 of FIG. 3, switch $S1_{K0}$ of FIG. 4 also cooperates with switch S2 of FIG. 3 to sample the input signal $V_{IN}$ at capacitor $C_{K0}$. Thereafter, during the corresponding (immediately following) dump operation performed by switches S3 and S4 of FIG. 3, switch $S3_{K1}$ of FIG. 4 cooperates with switch S4 of FIG. 3 to dump the charge from capacitor $C_{K1}$ while the charge from capacitor $C_{IN}$ of FIG. 3 is also being dumped via switches S3 and S4 of FIG. 3. (2) During the next sample operation of switches S1 and S2 of FIG. 3, switch $S1_{K1}$ of FIG. 4 cooperates with switch S2 of FIG. 3 to perform a sample operation with respect to capacitor $C_{K1}$.

During the corresponding (immediately following) dump operation performed by switches S3 and S4 of FIG. 3, switch $S3_{K2}$ of FIG. 4 cooperates with switch S4 of FIG. 3 to dump the charge from capacitor $C_{K2}$. (3) During the next sample operation of switches S1 and S2 of FIG. 3, switch $S1_{K2}$ of FIG. 4 cooperates with swtich S2 of FIG. 3 to perform a sample operation with respect to capicitor $C_{K2}$. During the corresponding (immediately following) dump operation performed by switches S3 and S4 of FIG. 3, switch $S3_{K3}$ of FIG. 4 cooperates with switch S4 of FIG. 3 to dump the charge from capacitor $C_{K3}$. (4) During the next sample operation of switches S1 and S2 of FIG. 3, switch $S1_{K3}$ of FIG. 4 cooperates with switch S2 of FIG. 3 to perform a sample operation with respect to capacitor $C_{K3}$. During the corresponding (immediately following) dump operation performed by switches S3 and S4 of FIG. 3, switch $S3_{K4}$ of FIG. 4 cooperates with switch S4 of FIG. 3 to dump the charge from capacitor $C_{K4}$. (5) During the next sample operation of switches S1 and S2 of FIG. 3, switch $S1_{K4}$ of FIG. 4 cooperates with switch S2 of FIG. 3 to perform a sample operation with respect to capacitor $C_{K4}$. During the corresponding (immediately following) dump operation performed by switches S3 and S4 of FIG. 3, switch $S3_{K0}$ of FIG. 4 cooperates with switch S4 of FIG. 3 to dump the charge from capacitor $C_{K0}$.

During the next sample operation of switches S1 and S2 of FIG. 3, switch $S1_{K0}$ of FIG. 4 again cooperates with switch S2 of FIG. 3 to perform another sample operation with respect to capacitor $C_{K0}$, whereby it can be seen that step (1) above is performed again, and steps (1)–(5) are repeated.

As above-described operations (1)–(5) demonstrate, in general, one or more capacitors can be charged at the same time, and the charge from one or more capacitors can be dumped at the same time during a given dump phase.

The above-described operation of the filter bank of FIG. 4 in response to the switch controller 33 causes the charge corresponding to the (i–4)th sample (input that was sampled four clock periods before the current period) to be dumped from a capacitor in FIG. 4 in parallel with the dumping of the charge corresponding to the ith (current) sample from capacitor $C_{IN}$ of FIG. 3. This operation implements the filter characteristic of FIG. 5.

As indicated above, a plurality of filter banks can be provided at 21 in order to provide an FIR filter having any desired number of taps. As shown in FIGS. 4 and 5, the filter bank(s) at 21 can implement very simple FIRs that can be used to attenuate the desired interferer at the desired frequency. Undesirable phase distortion can be avoided by using linear phase FIR filters, such as illustrated in FIG. 4. The capacitors in the filter bank(s), for example capacitors $C_{K0}$–$C_{K4}$ can of course be scaled to produce the desired filter characteristics. Such capacitor scaling in order to obtain a desired filter characteristic is well known in the art of switched capacitor filter design.

An automatic gain control (AGC) function can be easily provided, for example, by switching the integrating capacitor $C_{INT}$ in FIG. 3 from one value to another, thereby effectively scaling the signal. Because this signal scaling occurs after the interferers have been attenuated by the filter at 21, distortion is reduced in the integrator output 36.

The exemplary bank of capacitors in FIG. 4 can implement one or more FIR responses, depending on the operation of the switch controller 33 of FIG. 3. Different FIR responses can implement different filters, or also different scalings of the same filter. The FIR filter to be implemented determines which capacitors will be used for sampling and which capacitors will be used for dumping in each cycle. Using straightforward digital design techniques, the switch controller 33 can be designed to implement the switching sequence necessary to produce the desired FIR response.

In some embodiments, the switched capacitor filter 21 can be designed together with the anti-aliasing filter 13 (see also FIG. 1) to provide optimization of the overall performance. The goal of this optimization is to attenuate the interferers according to the communication channel specifications while minimizing the power consumption in the analog anti-aliasing filter, the FIR filter, and the ADC.

According to another exemplary feature of the present invention, FIR filters with negative coefficients can be readily obtained in differential implementations by cross-coupling those capacitors which sample the positive input such that they are dumped to the negative summing node, and vice versa.

Figure 6:
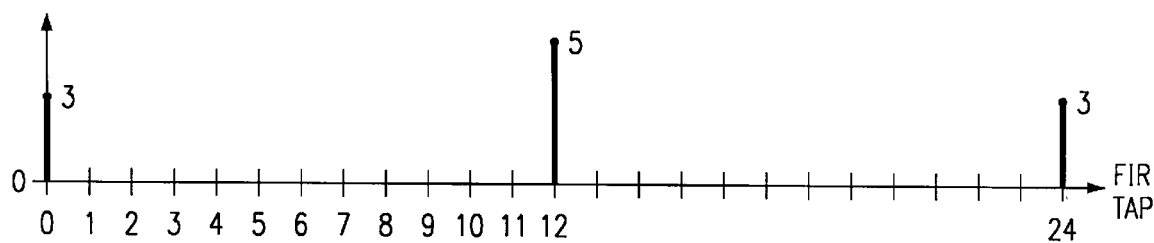
FIG. 6 graphically illustrates an impulse response of an exemplary filter bank according to the invention.
Figure 7:
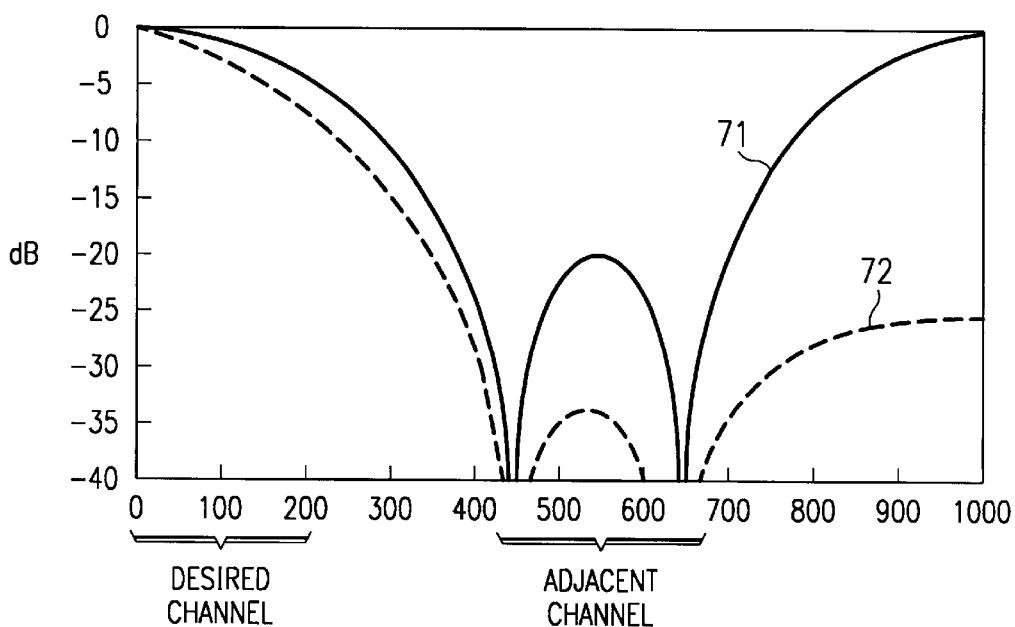
FIG. 7 graphically illustrates the frequency response of a filter bank having the impulse response of FIG. 6.

FIG. 6 graphically illustrates the impulse response of an exemplary switched capacitor FIR filter according to the invention. The filter characteristic of FIG. 6 is suitable, for example, for use in a communication receiver in a GSM system. FIG. 7 graphically illustrates the performance associated with the filter characteristic of FIG. 6. The curve at 71 illustrates the performance when only the FIR filter of FIG. 6 is utilized, and the curve at 72 illustrates the performance when the FIR filter characteristic of FIG. 6 is combined with a third order anti-aliasing filter. The curve 72 demonstrates better than 25 dB rejection of interferers.

Figure 8:
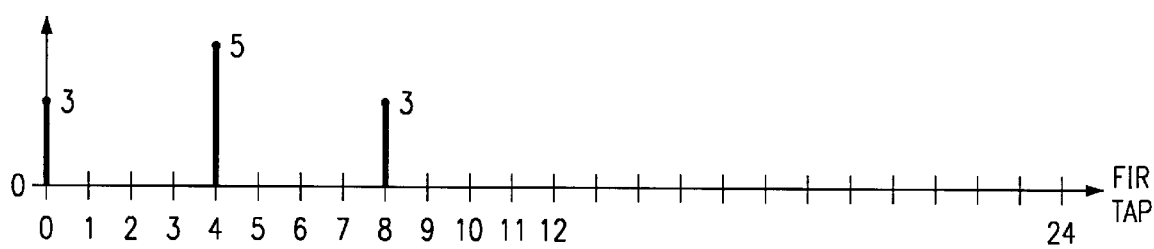
FIG. 8 graphically illustrates the impulse response of another exemplary filter bank according to the invention.
Figure 9:
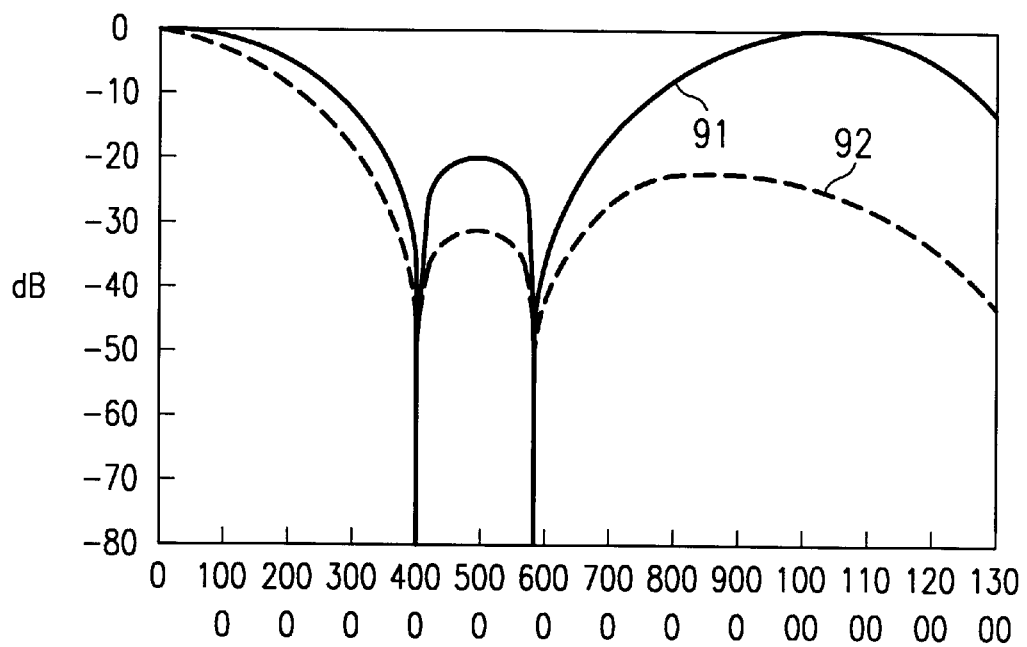
FIG. 9 graphically illustrates the frequency response of a filter bank having the impulse response of FIG. 8.

FIG. 8 graphically illustrates the impulse response of another exemplary switched capacitor FIR filter according to the invention. The filter characteristic of FIG. 8 is suitable, for example, for use in communication receivers operating in WCDMA systems. FIG. 9 graphically illustrates the performance obtained using the filter characteristic of FIG. 8 with a third order anti-aliasing filter (92) and with the filter of FIG. 8 only (91).

Figure 10:
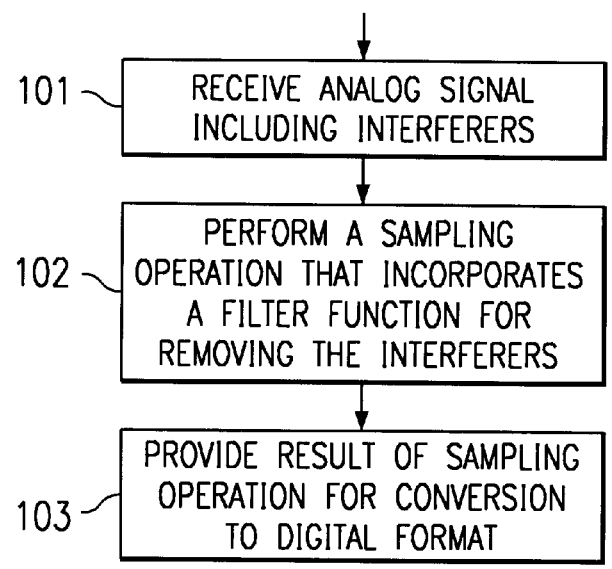
FIG. 10 illustrates exemplary operations which can be performed by the embodiments of FIGS. 2–4.

FIG. 10 illustrates exemplary operations which can be performed by the communication receiver embodiments of FIGS. 2–4. At 101, the analog signal, including interferers, is received. At 102, the above-described sampling operation, incorporating the filter function for removing the interferers, is performed. At 103, the result of the sampling operation is provided (dumped) for conversion to digital format.

It should be clear from the foregoing description that the present invention provides a highly linear, low power technique for filtering out-of-band interferers, while still enabling a fully integrated communication receiver by eliminating external filter components. By filtering the out-of-band interference before conversion of the signal into digital format, the design complexity of the ADC is reduced as compared to prior art arrangements wherein all of the interferers are converted into digital format and then filtered digitally. The invention can utilize a simple, passive FIR switched capacitor network (merged with the functionality of the ADC) with a very small number of non-zero coefficients, and the filter can be optimized to produce band-stop regions in alignment with the most critical interferers. This enables the use of ADCs having a dynamic range that is lower by more than 12 to 20 dB relative to ADCs used in direct conversion receivers. Such lower dynamic range ADCs have lower size and power requirements, and also require less noise isolation. The small number of non-zero coefficients in the FIR filter, and its application at the sampling input of the ADC provide for a simple implementation. It can be shown that simple integer ratios for the non-zero coefficients provides still more reductions in the size and dynamic range required by the ADC. Moreover, by simply altering the switch control applied to the FIR filter bank, the filter can be programmed to meet different band requirements as needed. This is particularly useful for multi-mode transceiver designs, and can also permit ADCs and filters to be shared between bands, thereby reducing the overall cost. Significant power reduction results from merging the FIR filter as part of the input stage of a switched capacitor ADC ($\Delta\Sigma$, piplined or any other ADC that has a single stage at its input to perform the sampling function). The first stage of such converters is the critical stage for linearity and signal-to-noise performance. The invention re-uses this first stage for the FIR function, and also re-uses the ADC's integrator (see 30 in FIG. 3) to complete the realization of the filter, thereby advantageously achieving power reductions.

Although exemplary embodiments of the invention have been described above in detail, this does not limit the scope of the invention, which can be practiced in a variety of embodiments.

What is claimed is:

1. A method of converting an analog signal into a digital signal, comprising:

receiving the analog signal;

sampling the analog signal at a plurality of points in time to produce a sampled signal which represents the analog signal;

incorporating into said sampling step an operation which concurrently filters and performs analog-to-digital conversion on the analog signal such that the digital signal represents a filtered version of the analog signal.

2. The method of claim 1, wherein said filtering operation is a finite impulse response (FIR) filtering operation.

3. The method of claim 2, wherein said finite impulse response filtering operation is a linear phase finite impulse response filtering operation.

4. The method of claim 1, wherein said incorporating step includes using a switched capacitor filter bank to implement the filtering operation.

5. The method of claim 4, wherein said using step includes controlling switches in the switched capacitor filter bank in a first manner to realize a first filtering operation.

6. The method of claim 5, wherein said using step includes controlling switches in the switched capacitor filter bank in a second manner to realize a second filtering operation.

7. The method of claim 1, wherein said sampling step includes charging more than one capacitor simultaneously.

8. The method of claim 7, wherein said sampling step includes dumping charges from more than one capacitor simultaneously.

9. The method of claim 1, wherein said sampling step includes dumping charges from more than one capacitor simultaneously.

10. The method of claim 1, wherein said sampling step includes dumping from a first capacitor to a charge summing node a first charge that represents a first sample of the analog signal while also simultaneously dumping from a second capacitor to the charge summing node a second charge that represents a second sample of the analog signal which timewise preceded the first sample in the analog signal.

11. The method of claim 1, wherein the analog signal is a communication signal carried on a frequency channel, and wherein the filtering operation filters interfering frequencies out of the analog signal.

12. An apparatus for use in converting an analog signal into a digital signal, comprising:

an input for receiving the analog signal;

a sampler coupled to said input for performing on the analog signal a sampling operation wherein the analog signal is sampled at a plurality of points in time to produce a sampled signal which represents the analog signal;

a switched control circuit coupled to said sampler for incorporating into said sampling operation an operation which concurrently filters and performs analog-to-digital conversion on the analog signal such that the digital signal represents a filtered version of the analog signal.

13. The apparatus of claim 12, wherein said filtering operation is a finite impulse response (FIR) filtering operation.

14. The apparatus of claim 12, wherein said finite impulse response filtering operation is a linear phase finite impulse response filtering operation.

15. The apparatus of claim 12, wherein said filter includes a switched capacitor filter bank.

16. The apparatus of claim 15, including a switch controller coupled to said switched capacitor filter bank for controlling switches in said switched capacitor filter bank to realize a desired filtering operation.

17. The apparatus of claim 12, wherein said sampler includes a first switched capacitor network having a first capacitor for selectively storing and dumping charge.

18. The apparatus of claim 17, wherein said filter includes a second switched capacitor network having a second capacitor for selectively storing and dumping charge.

19. The apparatus of claim 18, wherein said first and second capacitors are connected to a common node.

20. The apparatus of claim 18, wherein said first switched capacitor network includes a switch connected to said first capacitor for use in charging said first capacitor, and wherein said switch is also connected to said second capacitor for use in charging said second capacitor.

21. The apparatus of claim 18, wherein said second switched capacitor network includes a plurality of capacitors for selectively storing and dumping charges.

22. The apparatus of claim 18, including a switch controller coupled to said first and second switched capacitor networks for controlling switches in said first and second switched capacitor networks such that said first and second capacitors store respective charges simultaneously.

23. The apparatus of claim 22, wherein said switch controller is further for controlling switches in said first and second switched capacitor networks such that said first and second capacitors dump respective charges simultaneously.

24. The apparatus of claim 23, wherein said charge dumped from said first capacitor represents a first sample of the analog signal, and wherein said charge dumped from said second capacitor represents a second sample of the analog signal which timewise preceded the first sample in the analog signal.

25. The apparatus of claim 24, wherein said first and second capacitors are connected to a common node, and including a switch coupled to said switch controller for, under control of said switch controller, selectively connecting said common node to an input of a further stage of said apparatus.

26. The apparatus of claim 12, wherein the analog signal is a communications signal carried on a frequency channel, and wherein said filtering operation filters interfering frequencies out of the analog signal.

27. The apparatus of claim 12, including said circuit coupled to said output, and wherein said circuit includes a portion of said filter.

28. The apparatus of claim 27, wherein said portion of said filter includes an integrator circuit.

29. A communication receiving apparatus, comprising:

an input for receiving a communication signal at a first frequency;

a mixer coupled to said input for mixing said communication signal down from said first frequency to a second frequency; and an analog-to-digital conversion apparatus coupled to said mixer for converting said second frequency signal from analog format to digital format, said analog-to-digital conversion apparatus including a sampler coupled to said mixer for performing on said second frequency signal a sampling operation wherein said second frequency signal is sampled at a plurality of points in time to produce a sampled signal which represents said second frequency signal, a switched control circuit coupled to said sampler for incorporating into said sampling operation an operation which concurrently filters and performs analog-to-digital conversion on said second frequency signal such that the digital signal represents a filtered version of said second frequency signal.

30. The apparatus of claim 29, wherein said circuitry includes an integrator circuit.

31. The apparatus of claim 30, wherein said integrator circuit is a single-ended integrator circuit.

32. The apparatus of claim 29, wherein said circuitry includes delta sigma modulation circuitry.

* * * * *